United States Patent [19]

Moscicki

[11] Patent Number: 5,736,789
[45] Date of Patent: Apr. 7, 1998

[54] BALL GRID ARRAY CASING FOR INTEGRATED CIRCUITS

[75] Inventor: Jean-Pierre Moscicki, Saint Egreve, France

[73] Assignee: SGS-Thomson Microelectronics S.A., Saint Genis, France

[21] Appl. No.: 506,656

[22] Filed: Jul. 25, 1995

[30] Foreign Application Priority Data

Jul. 26, 1994 [FR] France ................ 94 09490

[51] Int. Cl.$^6$ ................................ H01L 23/48
[52] U.S. Cl. ............ 257/774; 257/778; 257/779; 257/787
[58] Field of Search .................... 257/778, 780, 257/779, 787, 774

[56] References Cited

U.S. PATENT DOCUMENTS

| | | | |
|---|---|---|---|
| 5,151,771 | 9/1992 | Hiroi et al. | 257/676 |
| 5,216,278 | 6/1993 | Lin et al. | 257/688 |
| 5,218,234 | 6/1993 | Thompson et al. | 257/787 |
| 5,355,283 | 10/1994 | Marrs et al. | 257/787 |
| 5,400,220 | 3/1995 | Swamy | 257/780 |

FOREIGN PATENT DOCUMENTS

A 57-079652  5/1982  Japan .............. H01L 23/48

OTHER PUBLICATIONS

French Search Report from French Patent Application No. 94 09490, filed Jul. 26, 1994.

Patent Abstracts of Japan, vol. 18, No. 364 (E–1575) Jul. 8, 1994 & JP-A-06 097 666 Hitachi, Ltd.

Patent Abstract of Japan, vol. 14, No. 190 (E–0918) Apr. 18, 1990 & JP-A-02 037 761 NEC Corp.

*Primary Examiner*—Wael Fahmy
*Assistant Examiner*—Roy Potter
*Attorney, Agent, or Firm*—Wolf, Greenfield & Sacks, P.C.; James H. Morris

[57] ABSTRACT

An integrated circuit casing includes an insulating plate having metallized through holes connected to conductive tracks. The conductive tracks on the lower surface extend to first pads which are designed to receive connection balls. The conductive tracks of the upper surface extend to second pads connected to terminals of an integrated circuit chip. The chip is glued on the upper surface of the plate. An encapsulation material embeds the chip. A first insulating layer is deposited on the lower surface of the plate and etched away in front of the first pads. A second insulating layer is deposited on the upper surface of the plate and etched away in front of the second pads and the through holes, the encapsulation material filling the holes.

28 Claims, 2 Drawing Sheets

BALL GRID ARRAY CASING FOR INTEGRATED CIRCUITS

BACKGROUND OF THE INVENTION

1. Field of the Invention

The present invention relates to a casing for an integrated circuit, and a method for fabricating such a casing.

2. Discussion of the Related Art

One type of conventional integrated circuit casing includes an insulating plate, on an upper surface of which is mounted an integrated circuit chip which is then subsequently encapsulated. On the upper surface of the chip, terminals are connected to connection pads on the upper surface of the plate. A lower surface of the plate includes an array, generally repetitive, of conductive connection bumps or balls. Each connection ball is connected to one of the connection pads on the upper surface of the plate through a metallized hole. This type of casing is usually referred to as a Ball Grid Array (BGA) casing.

In a first type of BGA casing, the connection bumps are made of hard material, generally copper. The setting of the casing on an electronic board is made by soft soldering with interposition of tin solder between each bump and a copper pad of the board. European patent application 0,536,418 describes such a casing. A drawback of such a casing is that the bump array must be made during the manufacturing of the plate aimed at receiving the integrated circuit chip. Another drawback is that the setting of the casing on an electronic board is critical because of the tin solder which must be positioned between the casing and the board. Another drawback is that the casing is spaced apart from the board by the copper bumps, which is detrimental to the mechanical strength of the casing on the board.

In order to facilitate the setting of a BGA casing, it is preferred to use connection balls which are directly of a soft soldering material, such as tin solder material. Such connection balls melt during the setting of the casing in order to ensure an optimal connection between the casing and the board.

FIG. 1 represents an exemplary conventional structure of such a casing. FIG. 1 is a partial cross-sectional view of such a casing close to one edge of an integrated circuit chip 1. The chip 1 is disposed on an upper surface of an insulating plate 2, which can be the type used to form printed circuit boards. Plate 2 includes metallized holes 3 individually connected, on the upper surface of the plate 2 and through conductive tracks 14, to connection pads 4, in turn connected through connection wires 5 to the terminals of the chip 1. The metallized holes 3 are connected, on a lower surface of the plate 2 and through conductive tracks 15 and pads 6, to balls 7 which constitute the connection contacts of the casing. Each surface of the plate 2 is coated with an insulating photoresist layer, 8 and 9, respectively, which are etched at the positions of pads 6 and 4, respectively. A layer of glue 10 is generally interposed between the chip 1 and the upper insulating layer 9. The whole structure is coated, on the upper surface, with an encapsulating epoxy resin 11.

The manufacturing of such a casing comprises two separate phases. A first phase concerns the manufacturing of the plate 2 for receiving the integrated circuit chip 1. A second mounting phase concerns the assembly of the chip 1 and the encapsulation.

The first phase includes, generally, the following steps. In a first step, metallized through holes are formed in an insulating plate which is metallized on both surfaces, generally with copper. Such through holes are drilled and then metallized. In a second step, an etching mask is formed to define a pattern of conductive tracks 14 and 15 and the pads 4 and 6. In a third step, the copper layers are chemically etched on both surfaces of the plate according to the pattern in order to obtain, in the metallized layers of the upper and lower surfaces of the plate, the conductive tracks 14 and 15 and the pads 4 and 6. The mask is then removed. In a fourth step, the insulating layers 8 and 9 are formed to protect, permanently, the conductive tracks 15 and 14, respectively. The insulating layers 8 and 9 are made of photoresist material which is etched away at the positions of the pads 6 and 4, respectively. Preferably, in a fifth step, a high conductive material, such as nickel/gold, is electrolytically deposited on the pads 4 and 6.

The plate 2 is then finished and ready to receive an integrated circuit chip 1.

The second phase includes, generally, the following steps. In a first step, the chip 1 is glued on the upper surface of the plate 2. In a second step, the chip is wired, i.e., the pads of the upper surface of the chip 1 are connected to the pads 4, preferably, by means of gold wires 5. In a third step, the chip 1 and the wires 5 are encapsulated in an epoxy resin 11. In a fourth and last step, the connection balls 7 are formed on the pads 6 of the lower surface of the plate 2. The balls 7 are made of a soft soldering material, such as tin solder.

A problem encountered in the conventional casing described above is that the insulating layers 8 and 9 which are deposited on the surfaces of plate 2, do not fill the metallized holes 3 disposed through plate 2. This causes the formation of air pockets 16 in these holes which are trapped between the two photoresist layers 8 and 9, and unavoidably filled with dampness. These bubbles are damaging, because they expand, due to the heat to which the casing is subjected during the subsequent encapsulation process or when the integrated circuit is used. The bubbles may then cause the insulating layer 8 or 9 to break. Due to this risk of breaking, the metallized holes cannot be disposed under the chip 1. Indeed, breaking could damage the chip itself. Breakings are also detrimental for the insulation of the lower surface of the plate 2.

The bumps of the first type of casing described in European patent application 0,536,418 are sometimes made in such a manner that they fill the metallized holes. However, in that case, the bumps are necessarily at the locations of the holes. Furthermore, the manufacturing process is then much more complicated because additional deposition and etching steps are necessary.

A further drawback which is common to the two types of casing described above is due to the anchoring of the encapsulation material which is molded on the upper surface of the plate. Indeed, the cohesiveness of the casing, more precisely of the epoxy resin with the plate, is ensured only by the coating of the conductive wires 5. Since these wires are especially fine and delicate, the casing is liable of being damaged by shocks, especially as regards the connections between the chip and the plate.

SUMMARY OF THE INVENTION

An object of the present invention is to avoid these drawbacks by providing an integrated circuit chip casing, using a printed circuit board whose lower surface is provided with an array of soft soldering connection balls, which prevents any insulation defect on the lower surface of the plate.

Another object of the present invention is to ensure an anchoring of the encapsulation material, independently of the chip and of its connection wires to the plate.

In one illustrative embodiment of the invention, an integrated circuit is provided having an integrated circuit chip and a plate is adapted to receive the chip on a chip receiving area. The chip is affixed to the plate on the chip receiving area with an adhesive. The plate has at least one hole within the chip receiving area and the adhesive at least partially fills the hole. According to one aspect of this embodiment, an insulating layer is provided on the plate which does not cover the at least one hole. According to another aspect of this embodiment, at least one hole is provided in the plate outside the chip receiving area. A casing encapsulates the chip on the plate, and the casing substantially fills the at least one hole in the plate outside the chip receiving area.

In another illustrative embodiment of the invention, an integrated circuit is provided that includes an integrated circuit chip and an insulating plate adapted to receive the chip at a chip receiving area. The chip is mounted on the chip receiving area of the plate. The plate includes at least one hole disposed outside the chip receiving surface. The chip is encapsulated by a casing which at least partially fills the hole disposed beyond the outside of the chip receiving area.

Another embodiment of the present invention provides an integrated circuit casing which includes: an insulating plate having metallized through holes connected to conductive tracks, the conductive tracks of the lower surface extending to first pads designed to receive connection balls, the conductive tracks of the upper surface extending to second pads connected to terminals of an integrated circuit chip. The chip is glued on the upper surface of the plate. An encapsulation material encapsulates the chip on the plate. A first insulating layer is deposited on the lower surface of the plate and is etched in front of the first pads and a second insulating layer is deposited on the upper surface of the plate and is etched in front of the second pads and at least in front of the through holes, with the encapsulation material filling these holes.

According to one aspect of the invention, the plate has through holes disposed under the chip, the holes being at least partially filled with the anchoring glue of the chip.

According to another aspect of the invention, the second insulating layer is etched beneath the encapsulation material in all an area in which are formed the through holes.

According to another aspect of the invention, the insulating layers are made of a photoresist.

According to another aspect of the invention, the encapsulation material is an epoxy resin.

According to another aspect of the invention, the anchoring glue of the chip is thermally conductive.

Another object of the invention is to provide the manufacturing of such a casing without increasing the number of steps with respect to the known manufacturing processes. The present invention especially aims at separating a first phase for manufacturing the plate from a second phase for mounting and encapsulating the chip.

According to another illustrative embodiment of the invention, a method is provided for forming an integrated circuit including the steps: of providing a plate adapted to receive a chip on a chip receiving area; forming at least one hole in the plate in the chip receiving area using an adhesive, the adhesive substantially filling the at least one hole outside the chip receiving area.

According to another illustrative embodiment of the invention, a method is provided for forming an integrated circuit including the steps: of providing a plate having a chip receiving area; forming at least one hole in the plate outside the chip receiving area; mounting the chip on the chip receiving area; and encapsulating the chip to the first surface of the plate with a casing material, the casing material substantially filling the at least one hole in the plate.

In another embodiment of the invention, a process is provided for mounting an integrated circuit including the following steps. Forming metallized through holes in an insulating plate covered by conductive layers on its both surfaces; etching the conductive layers on the two surfaces of the plate, according to a track pattern for connecting the metallized holes to first pads to be connected to connection balls in the lower surface, and to second pads to be connected to terminals on the upper surface of an integrated circuit chip; depositing first and second insulating photoresist layers, respectively, on the lower and upper surfaces of the plate and etching the first layer at the location of the first pads; and etching the second layer at the location of the second pads and at least in front of the through holes; gluing the chip on the plate with a layer of glue; connecting terminals of the chip to the second pads, through conductive wires; encapsulating the chip in an epoxy resin; and depositing connection balls on the lower surface of the plate over the first pads.

According to one aspect of the process of mounting the integrated circuit, the second photoresist layer is etched at least in all a portion of the plate in which are formed the through holes and which is designed to be coated with an epoxy resin or with the glue.

According to another aspect of the process of mounting the integrated circuit, the process includes a step of electrolytically depositing a high conductivity material at least over the connection pads and over the inner surface of the holes, prior to the step of gluing the chip on the plate.

The foregoing and other objects, features, aspects and advantages of the invention will become apparent from the following detailed description of the present invention when taken in conjunction with the accompanying drawings.

For the sake of clarity, the various figures are not drawn to scale.

DETAILED DESCRIPTION

Figure 1:
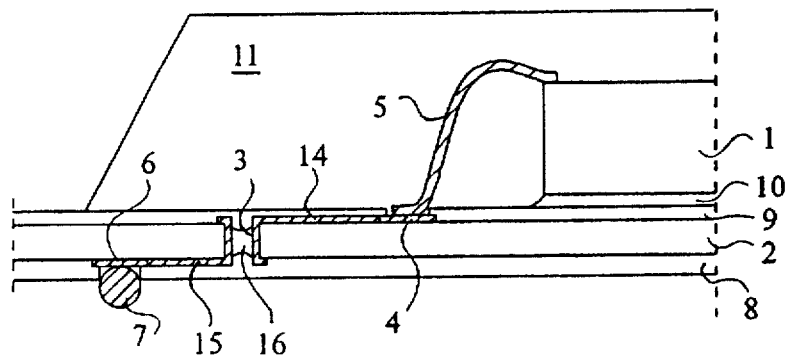
FIG. 1 is a partial cross-sectional view of a conventional circuit chip.
Figure 2:
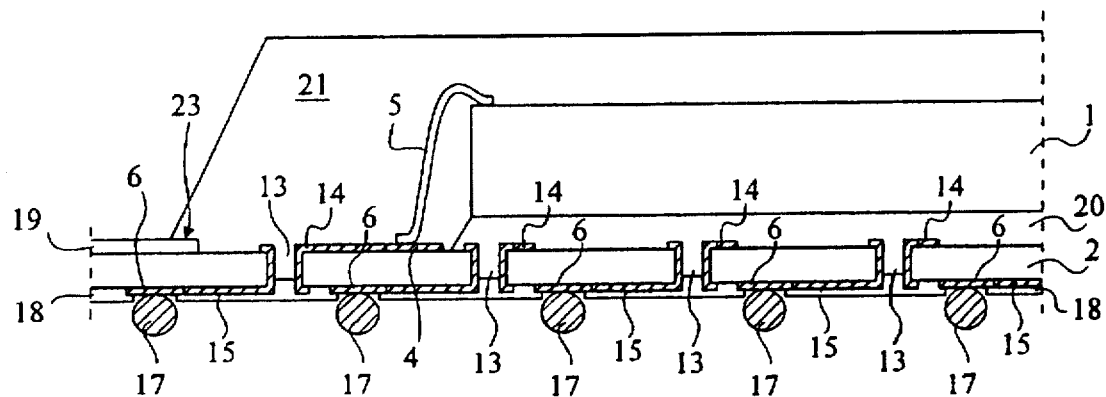
FIG. 2 is a partial cross-sectional view of an embodiment of a casing according to the present invention.
Figure 3A:
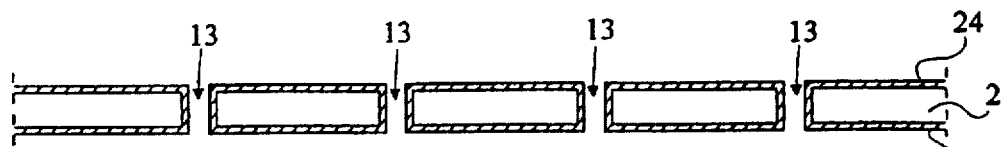
FIGS. 3A–3F are partial cross-sectional views of different steps of a process for fabricating an integrated circuit casing according to the invention.
Figure 3B:
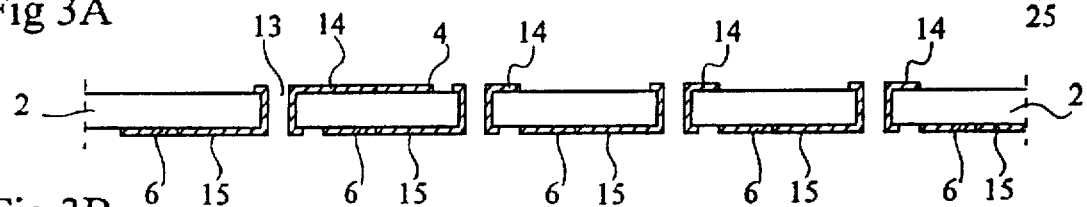
Figure 3C:
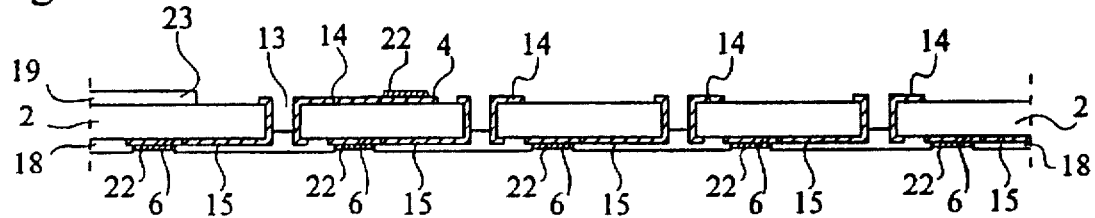
Figure 3D:
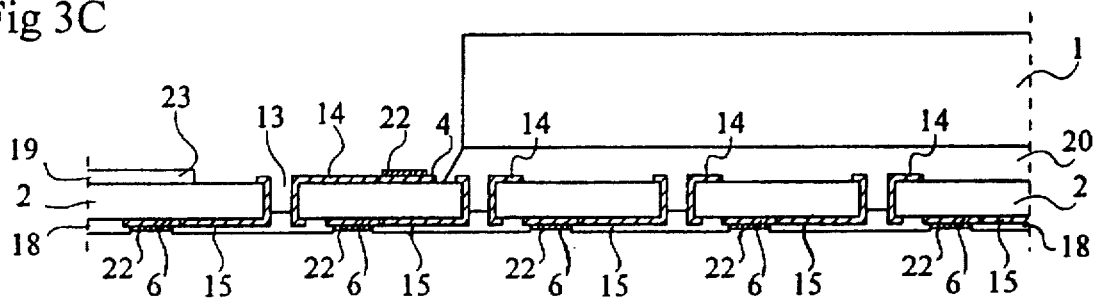
Figure 3E:
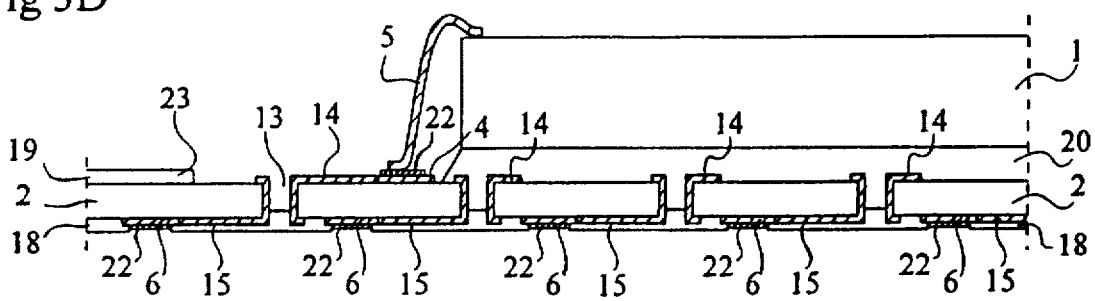
Figure 3F:
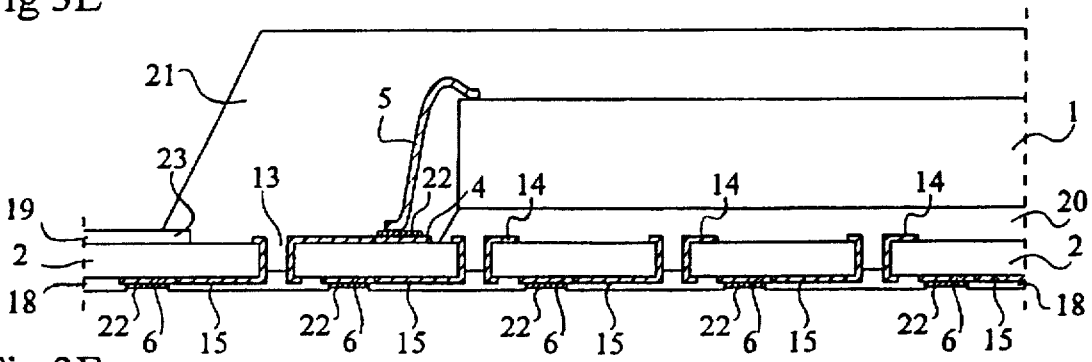

The casing according to one embodiment of the invention as represented in FIG. 2 differs from conventional casings by the absence of the insulating layer 19 over the upper surface of plate 2, which receives an integrated circuit chip 1, at the places where the metallized holes 13 are formed.

The encapsulation structure according to the invention can include an insulating layer 19 on the upper surface of the plate 2, only outside a portion coated with an encapsulation material 21 such as an epoxy resin and in which are formed all the through holes 13. Only a small part 23 of the insulating layer 19 is then present beneath the periphery of the encapsulation material 21 to ensure an insulating connection between that material 21 and the insulating layer 19. The chip is mounted on the plate at a chip receiving area.

Metallized holes 13 are disposed beneath the chip 1 (in the chip receiving area), and, if required, outside the vertical area of chip 1 (outside the chip receiving area). The holes 13 beneath the chip are filled with an anchoring glue. The holes in the plate outside the chip receiving area of the chip 1 are filled with an encapsulation material 21 such as epoxy resin. This result is obtained because both the anchoring glue 20 and the encapsulation material 21 are more liquid than the photoresist used to form the insulating layers 18 and 19. In addition, the glue and resin are injected under a pressure. Preferably, when gluing the chip, the chip is pressed and pushed laterally during its positioning after the anchoring glue has been applied. For the encapsulation, the molding injection pressure is preferably maintained during solidification. Thus, metallized holes 13 and connection elements, such as balls 17, can be provided beneath the chip 1 without any risks. This allows the reduction of the surface area of plate 2 or, with the same surface, a larger number of connection elements, such as balls 17 can be disposed on the plate.

A second advantage of the invention is to improve anchoring of the glue 20 (thus, of the chip 1) and of the encapsulation material 21 on the plate 2, because the holes 13 constitute anchoring points for these materials. The cohesiveness of the casing is ensured by the anchoring of the encapsulation material on the plate, independently of the chip and of the connection wires 5 between the chip 1 and the plate 2.

An exemplary implementation of a process for mounting an integrated circuit chip according to the invention will be described hereinafter. This example is illustrated in FIGS. 3A–3F which represent the different steps of this process.

According to the invention, the mounting process does respect the two phases of a conventional manufacturing method. A first phase concerns the manufacturing of the plate 2 aimed at receiving an integrated circuit chip 1. A second phase concerns the mounting of the chip I on the plate 2 and the encapsulation.

In a first step of the first phase (FIG. 3A), the insulating plate 2, covered on both surfaces by a conductive layer, for example copper 24 and 25, is drilled at places where the metallized holes are to be formed and the holes 13 are metallized, for example with copper.

In a second step of the first phase (FIG. 3B), the conductive layers 24 and 25 are chemically etched on the two surfaces of plate 2 to create tracks 14 and 15 and connection pads 4 and 6 on the upper and lower surfaces of the plate 2, respectively.

In a third step of the first phase (FIG. 3C), a first and a second insulating photoresist layer 18 and 19, respectively, are deposited on the lower and upper surfaces, respectively, of the plate 2. The first layer 18 is then etched at places where the balls 17 will be subsequently disposed on pads 6, thus the pads 6 are exposed; and the second layer is then etched, at least at places where the metallized holes 13 and pads 4 are provided, thus the metallized holes 13 and pads 4 are exposed. Preferably, the upper photoresist layer 19 is etched over the whole area to be subsequently coated with an epoxy resin 21. Only a small part 23 of the upper insulating layer is thus present beneath the periphery of the epoxy resin 21.

To improve the contacts between wires 5 or balls 17, which will be subsequently deposited, and their respective connection pads 4 or 6, respectively, a conductive layer 22 can be electrolytically deposited on the two surfaces of the plate 2, during a fourth step, if required. This layer is, for example, made of nickel or gold. It is deposited, on the lower surface, over pads 6 at places where the photoresist layer 18 is etched away. The nickel/gold layer 22 on the upper surface is deposited at places where the layer 19 is etched, i.e., at least over pads 4 and the inner surfaces of the metallized holes 13.

The plate 2 is then ready to receive an integrated circuit chip 1.

In a first step of the second phase (FIG. 3D), the chip 1 is glued to the plate with a glue layer 20. The glue 20 penetrates through capillary action into the metallized holes 13 located beneath the chip 1, thereby improving anchoring of the glue layer 20 while preventing air bubbles from being generated or trapped in holes 13.

In a second step of the second phase (FIG. 3E), the pads 4 of the upper surface are connected to the terminals of chip 1 through conductive wires 5, which can be for example, gold wires. Because of the location of the section in the figures, only one wire is represented. In practice, wires 5 are provided over all the sides of chip 1.

In a third step of the second phase (FIG. 3F), the whole structure is encapsulated in an epoxy resin 21. Like glue 20, the epoxy resin 21 fills through capillary action the holes 13 located outside the chip 1.

In a fourth and last step (not shown), balls 17 are formed on pads 6 of the lower surface of plate 2, at places where the photoresist layer 18 has been removed. Hence, a casing as represented in FIG. 2 is obtained. These balls 17 are constituted by soft soldering material, for example tin solder, to be welded during the setting of the casing on an electronic board.

The invention prevents the chip 1 or the photoresist layer 18 or 19 from being damaged due to the expansion of damp air included in the through holes 3 of conventional structures.

An advantage of the method of the invention is that it does not add any manufacturing step with respect to the known manufacturing methods. Another advantage of the present invention is that the manufacturing method is divided into two distinct phases, the first phase relating to the preparation of the plate, and the second phase relating to the mounting and the encapsulation.

It should be appreciated that various modifications can be made to the above disclosed embodiments. More particularly, each of the layer materials described can be replaced with one or more materials having the same characteristics and/or performing the same function.

Additionally, the exemplary steps can be modified depending on the deposition and/or etching means that are used.

Other modifications are possible. For example, if the metallized holes 13 disposed beneath chip 1 must be connected to distinct terminals, the glue 10 should be insulating. In the case when all the holes 13 are connected to the same ground plane, the glue 20 can be electrically conductive. The glue may have thermally conductive characteristics.

If the thickness of the plate 2 is such that some very small air pockets are liable to remain in the holes 13 after encapsulating, the resist layer 18 can be pierced in front of these holes, for example with a tool formed by a pattern of pins. Such a piercing is made possible because the connection balls are not located in front of the holes. Furthermore, such a piercing does not impair the insulation on the lower surface of the plate because the piercing is made in areas (the holes 13) where the insulating layer 19 already covers an insulating material (the epoxy resin 21).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. An integrated circuit comprising:

an insulating plate having metallized holes disposed therethrough, the metallized holes connected to conductive tracks, the conductive tracks of a lower surface extending to first pads designed to receive connections balls, the conductive tracks of an upper surface extending to second pads connected to terminals of an integrated circuit chip glued on the upper surface the insulating plate;

through holes disposed under the chip, the holes disposed under the chip being filled with glue anchoring the chip;

an encapsulation material embedding the chip;

a first insulating layer deposited on the lower surface of the plate and etched away in front of said first pads;

a second insulating layer deposited on the upper surface of the plate and etched away in front of said seconds pads;

wherein said second insulating layer is etched away at least in front of the metallized holes, said first insulating layer and said encapsulation material at least partially filling said holes.

2. The casing of claim 1, wherein the second insulating layer is entirely etched away beneath the encapsulation material at least in all an area in which are formed the through holes.

3. The casing of claim 1, wherein the glue anchoring the chip is thermally conductive.

4. An integrated circuit comprising:

an insulating plate having metallized holes disposed therethrough, the metallized holes connected to conductive tracks, the conductive tracks of a lower surface extending to first pads designed to receive connections balls, the conductive tracks of an upper surface extending to second pads connected to terminals of an integrated circuit chip glued on the upper surface of the insulating plate;

an encapsulation material embedding the chip;

a first insulating layer deposited on the lower surface of the plate and etched away in front of said first pads;

a second insulating layer deposited on the upper surface of the plate and etched away in front of said seconds pads;

wherein said second insulating layer is etched away at least in front of the metallized holes, said first insulating layer and said encapsulation material at least partially filling said holes and wherein the first and second insulating layers are made of photo resist.

5. The casing of claim 4, wherein the encapsulation material is an epoxy resin.

6. An integrated circuit comprising:

an insulating plate having an upper conductive surface electrically connected to a lower conductive surface, the plate adapted to receive an integrated circuit chip in a chip receiving area, and the plate having at least one hole disposed in the chip receiving area;

an integrated circuit chip mounted to the insulation plate in the chip receiving area; and an adhesive, disposed between the chip and the plate, that affixes the chip to the plate and at least partially fills the at least one hole disposed in the chip receiving area.

7. The integrated circuit of claim 6, further comprising an insulating layer disposed on the plate, the insulating layer at least partially filling the at least one hole disposed in the chip receiving area, the insulating layer and the adhesive substantially filling the at least one hole disposed in the chip receiving area.

8. The integrated circuit of claim 7, wherein the adhesive is electrically conductive.

9. The integrated circuit of claim 12, wherein the adhesive is electrically insulating.

10. The integrated circuit of claim 7, further comprising a second insulating layer, disposed on the plate, that exposes the at least one hole disposed in the chip receiving area.

11. The integrated circuit of claim 10, wherein the second insulating layer is disposed on the plate outside of the chip receiving area.

12. The integrated circuit of claim 6, wherein the at least one hole disposed in the chip receiving area includes an inner surface, the integrated circuit further comprising:

a conductive layer disposed on the inner surface of the at least one hole disposed in the chip receiving area; and a connection ball disposed on the plate, the connection ball being coupled to the chip through the conductive layer disposed on the inner surface of the at least one hole.

13. The integrated circuit of claim 6, wherein the plate further includes at least one hole disposed outside the chip receiving area, and wherein the integrated circuit further comprises:

a casing encapsulating the chip, the casing at least partially filling the at least one hole disposed outside the chip receiving area.

14. The integrated circuit of claim 6, further comprising a casing encapsulating the chip.

15. The integrated circuit of claim 14, wherein the casing is an epoxy resin.

16. The integrated circuit of claim 14, further comprising an insulating layer disposed on the plate having an aperture that exposes the chip receiving area, the casing encapsulating the aperture.

17. The integrated circuit of claim 6, wherein the at least one hole includes a plurality of holes in the chip receiving area, and each of the plurality of holes disposed in the chip receiving area is at least partially filled with the adhesive.

18. An integrated circuit comprising:

an insulating plate adapted to receive an integrated circuit chip in a chip receiving area, the plate having at least one hole disposed outside the chip receiving area;

an integrated circuit chip mounted to the plate in the chip receiving area;

a casing encapsulating the chip and at least partially filling the at least one hole disposed outside the chip receiving area; and an insulating layer mounted to the plate having an aperture that exposes the chip receiving area, the casing encapsulating the aperture.

19. The integrated circuit of claim 18, wherein the at least one hole disposed outside the chip receiving area is substantially free of air pockets.

20. The integrated circuit of claim 18, further comprising a plurality of connection elements, disposed on the plate, that each is coupled to the chip.

21. The integrated circuit of claim 18, wherein the at least one hole includes a plurality of holes disposed on the plate outside the chip receiving surface, and wherein the casing substantially fills each of the plurality of holes.

22. An integrated circuit comprising:

an insulating plate adapted to receive an integrated circuit chip in a chip receiving area, the plate having at least one hole disposed outside the chip receiving area and at least one hole disposed in the chip receiving area;

an integrated circuit chip mounted to the plate in the chip receiving area;

a casing encapsulating the chip and at least partially filling the at least one hole disposed outside the chip receiving area; and an adhesive that affixes the chip to the plate and substantially fills the at least one hole disposed in the chip receiving area.

23. An integrated circuit comprising:

an insulating plate adapted to receive an integrated circuit chip in a chip receiving area, the plate having at least one hole disposed in the chip receiving area;

an integrated circuit chip mounted to the plate in the chip receiving area;

means for preventing air pockets from forming in the at least one hole disposed in the chip receiving area; and an adhesive that affixes the integrated circuit chip to the plate, the adhesive at least partially filling the at least one hole disposed in the chip receiving area.

24. The integrated circuit of claim 23, wherein the adhesive is electrically conductive.

25. The integrated circuit of claim 23, wherein the adhesive is electrically insulative.

26. An integrated circuit comprising:

an insulating plate adapted to receive an integrated circuit chip in a chip receiving area, the plate having at least one hole disposed in the chip receiving area;

an integrated circuit chip mounted to the plate in the chip receiving area;

means for preventing air pockets from forming in the at least one hole disposed in the chip receiving area; and an insulating layer disposed on the plate, the insulating layer partially filling the at least one hole disposed in the chip receiving area.

27. An integrated circuit operable within a temperature range, comprising:

an insulating plate having first and second surfaces, the first surface being adapted to receive an integrated circuit chip in a chip receiving area, the insulating plate having at least one hole disposed in the chip receiving area;

an integrated circuit chip mounted to the first surface of the plate in the chip receiving area;

an insulating layer disposed on the second surface of the plate; and means for preventing the insulating layer from cracking due to heat when the chip is operated within the temperature range;

wherein the at least one hole disposed in the chip receiving area is substantially filled with conductive material.

28. The integrated circuit of claim 27, further comprising a second insulating layer disposed on at least a portion of the first surface of the plate, the second insulating layer exposing the at least one hole disposed in the chip receiving area.

* * * * *